(12) United States Patent
Liu

(10) Patent No.: US 10,854,468 B2
(45) Date of Patent: Dec. 1, 2020

(54) METHOD AND EQUIPMENT FOR PERFORMING CMP PROCESS

(71) Applicant: Taiwan Semiconductor Manufacturing Co., Ltd., Hsin-Chu (TW)

(72) Inventor: Wen-Kuei Liu, Xinpu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/919,269

(22) Filed: Jul. 2, 2020

(65) Prior Publication Data

US 2020/0335350 A1 Oct. 22, 2020

Related U.S. Application Data

(63) Continuation of application No. 15/885,271, filed on Jan. 31, 2018, now Pat. No. 10,734,240.

(60) Provisional application No. 62/592,811, filed on Nov. 30, 2017.

(51) Int. Cl.
*H01L 21/3105* (2006.01)
*H01L 21/66* (2006.01)
*H01L 21/67* (2006.01)
*H01L 21/02* (2006.01)
*B24B 37/00* (2012.01)

(52) U.S. Cl.
CPC ........ *H01L 21/31055* (2013.01); *B24B 37/00* (2013.01); *H01L 21/02024* (2013.01); *H01L 21/6715* (2013.01); *H01L 21/67075* (2013.01); *H01L 21/67092* (2013.01); *H01L 22/20* (2013.01); *H01L 22/12* (2013.01)

(58) Field of Classification Search
CPC ......... H01L 21/31055; H01L 21/02024; H01L 21/67075

See application file for complete search history.

(56) References Cited

U.S. PATENT DOCUMENTS

| | | | |
|---|---|---|---|
| 6,364,744 B1 | 4/2002 | Merchant et al. |
| 7,029,374 B2 | 4/2006 | Chen |
| 10,265,829 B2 | 4/2019 | Tsai et al. |

(Continued)

FOREIGN PATENT DOCUMENTS

| | | |
|---|---|---|
| CN | 105773399 A | 7/2016 |
| CN | 106863107 A | 6/2017 |

(Continued)

*Primary Examiner* — Errol V Fernandes
(74) *Attorney, Agent, or Firm* — Duane Morris LLP

(57) ABSTRACT

A chemical-mechanical planarization device and a method for using a chemical-mechanical planarization device in conjunction with a semiconductor substrate is provided. In accordance with some embodiments, the device includes: a pad disposed over a rotatable platen; a carrier head disposed over the pad and configured to retain a semiconductor substrate between the pad and the carrier head; a tank configured to retain a liquid containing composition; at least one tube fluidly coupled with the tank, the at least one tube comprising a photocatalyst therein; a nozzle fluidly coupled with the tank through the at least one tube and configured to supply the liquid containing composition onto the pad; and a light source configured to provide light to irradiate the photocatalyst, and the liquid containing composition passing through the at least one tube.

20 Claims, 5 Drawing Sheets

(56) References Cited

U.S. PATENT DOCUMENTS

2003/0022502 A1  1/2003  Matsui
2004/0255973 A1  12/2004 Chen
2017/0120414 A1  5/2017  Tsai et al.

FOREIGN PATENT DOCUMENTS

KR   20050092953 A   9/2005
TW     200501198 A   1/2005
TW     201722624 A   7/2017

METHOD AND EQUIPMENT FOR PERFORMING CMP PROCESS

PRIORITY CLAIM AND CROSS-REFERENCE

This application is a continuation application of U.S. application Ser. No. 15/885,271, filed Jan. 31, 2018, which claims the benefit of U.S. Provisional Application No. 62/592,811, filed Nov. 30, 2017, which application is expressly incorporated by reference herein in its entirety.

BACKGROUND

This disclosure relates to methods of making semiconductor devices. More particularly, the disclosed subject matter relates to a method for performing chemical mechanical polishing (CMP), and related equipment.

Chemical mechanical polishing/planarization (CMP) is a key process of smoothing surfaces of semiconductor wafers through both chemical etching and physical abrasion. A semiconductor wafer is mounted onto a polishing head, which rotates during a CMP process. The rotating polishing head presses the semiconductor wafer against a rotating polishing pad. Slurry containing chemical etchants and colloid particles is applied onto the polishing pad. Irregularities on the surface are removed to result in planarization of the semiconductor wafer.

The size of semiconductor wafers has increased to improve throughput and reduce cost per die. For example, in the transition from 300 mm to 450 mm wafer size, the wafer area increases by 125%. The uniformity in smoothness and thickness of the whole wafer becomes more difficult to maintain in these larger wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout the specification and drawings.

DETAILED DESCRIPTION

Figure 1A:
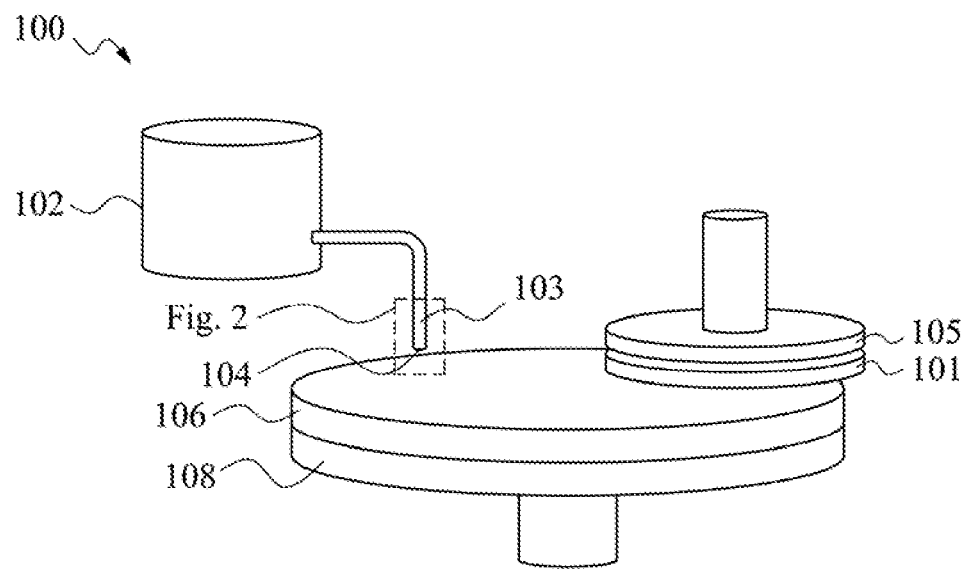
FIG. 1A is a schematic view showing an exemplary CM' system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a photocatalyst" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Unless expressly indicated otherwise, references to "a liquid containing composition" made herein will be understood to encompass any composition comprising a liquid, including but not limited to a slurry, a solution, a solvent, and any combination thereof. The liquid containing composition can be applied onto a pad during a CMP process. In some embodiments, a liquid containing composition is a slurry, which may optionally comprise hydrogen peroxide. In some other embodiments, a liquid containing composition is a solution comprising hydrogen peroxide. Such a solution may be mixed with a slurry before or during applied onto a polishing pad.

References to "a photocatalytic number" made herein will be understood to encompass a total number of units in a photocatalyst, which comprises at least one unit. Each unit may have a suitable shape and size.

In order to control the thickness of a semiconductor substrate, a CMP process may be used. In the CMP process, an abrasive or corrosive chemical liquid containing composition, such as a slurry or a colloid, is used in conjunction with a polishing pad to polish the surface of the substrate. This process is intended to even out any irregular topographies and make the substrate flat and planar. However, the efficacy of the polishing can vary. For example, the polishing pad can wear, thereby causing the material removal rate (MRR) from the substrate surface to be dependent on the age of the polishing pad at the time that the substrate is processed. In addition, variations in the composition of the liquid containing composition may also lead to variations in the amount of material removed from the substrate surface. This variability can cause a variety of issues. First, the variability can lead to increase within-substrate non-uniformity. In other words, the thickness of a given substrate may vary to an unacceptable level. Second, substrates that are processed later in time may be thicker than those processed earlier. Either of these conditions can lead to increased rejection of substrates.

The efficacy of the CMP process can be measured using various measurement and inspection techniques. For example, the thickness of the substrate can be measured as part of a final substrate acceptance test. This can be used to determine the MRR of the system by comparing the initial thickness and final thickness as well as polishing time. With time, the thickness of measured substrates may increase, indicating that less material is being removed during the CMP process. In order to accommodate the decrease in MRR, the polishing time for each substrate can be increased. However, this leads to an increase in processing time and a corresponding decrease in throughput.

The present disclosure provides an apparatus and process to maintain and/or adjust the MRR of a CMP system. This allows for consistent substrate thickness without an increase in processing time. As described further herein, a liquid containing composition (e.g., a slurry, a solution, or a solvent) passes over a photocatalyst prior to being applied to the pad of the CMP system. A light such as visible light or ultraviolet (UV) light is applied to the photocatalyst and the liquid containing composition passing through the tube, that leads to photocatalytic chemical reactions generating radicals such as hydroxyl radicals into a liquid containing composition such as a slurry or a solution applied to a polishing pad. These radicals are oxidative and lead to an increase in the MRR of the process.

FIG. 1A shows an exemplary CMP system 100 for a semiconductor substrate 101 according to one embodiment described herein. The substrate 101 can be any appropriate material. Substrate 101 can be a wafer comprising a semiconductor material. Examples of suitable materials for substrate 101 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

In some embodiments, substrate 101 is constructed of silicon. In addition, the substrate 101 can include various electrical components or features, and some device components being made such as transistors, interlayer dielectrics, and dielectrics. The CMP system 100 includes at least one tank 102 containing a liquid containing composition, at least one tube 103, and at least one nozzle 104 in communication with the at least one tank 102. The substrate 101 is engaged with a carrier head 105. The carrier head 105 is configured to rotate the substrate 101. The carrier head 105 retains the substrate 101 between a pad 106 and the carrier head 105. The carrier head may apply a downward pressure on the substrate 101 of from about 0.1 psi to about $10^6$ psi. The pad 106 is engaged with a platen 108. The platen 108 is rotatable to cause rotation of the pad 106. The platen 108 may rotate the pad 106 at a rate of between about 1 rpm and about 3000 rpm. The slurry from the tank is deposited on the pad 106 by the nozzle 104, as will be further described herein. The liquid containing composition may flow onto the pad 106 at a rate of between about 1 ml/min to about $10^5$ ml/min. The pad 106 can be constructed of any appropriate material. In one embodiment, the pad 106 is constructed of polyurethane. In addition, optionally, the pad 106 can include one or more grooves configured to direct the liquid containing composition to the substrate 101 or to discharge debris and spent liquid containing composition away from the substrate 101. The CMP system 100 can also include a conditioning arm (not shown) to resurface the pad 106.

The tank 102 is configured to store and/or receive a liquid containing composition such as a slurry or a solution to be used in the CMP process. The tank 102 can be located at any appropriate position. For example, in one embodiment, the tank 102 is located proximate the pad 106. In other embodiments, the tank 102 is located at a further distance from the pad 106. In some embodiments, the tank 102 provides a liquid containing composition such as a slurry, and/or a solution or solvent such as water to the pad 106.

The liquid containing composition such as a slurry can be composed of any appropriate materials for use in CMP processes. For example, the liquid containing composition can be a liquid containing composition including abrasive particles disposed in a liquid. For example, the liquid containing composition can include silicon dioxide, cerium oxide, aluminum oxide, silicon carbide, carbon, titanium dioxide, or any combination thereof. The liquid containing composition can also include other chemicals, such as rust inhibitors and bases. Examples of suitable ingredients for the liquid containing composition include, but are not limited to, fumed silica and alumina, suspended in an aqueous solution of a suitable pH range, for example, in the range of about 9 to about 12. In some embodiments, the liquid containing composition comprises cerium oxide in the range of 2 nm to 50 nm. In other embodiments, the liquid containing composition used in the CMP process comprises silica ($SiO_2$) particles in the range of from 0.01 µm to 0.1 µm, with a solid content in the range of from 0.1 wt. % to about 10 wt. % (e.g., from 1 wt. % to about 5 wt. %). In such embodiments, the liquid containing composition can have a pH value in the range of from 3 to 6.

The tank 102 can be fluidly coupled with the nozzle 104 through one or more tubes 103. The tubes 103 provide a passage through which the liquid containing composition passes to reach the nozzle 104. The tubes 103 can comprise any appropriate material such as, for example, PVC, polyolefin, polyurethane, polyethylene, polypropylene, nylon, PTFE, rubber, or silicone.

In some embodiments, the nozzle 104 is positioned above the pad 106 such that the contents of the tank 102 can be deposited on the pad 106.

Figure 2A:
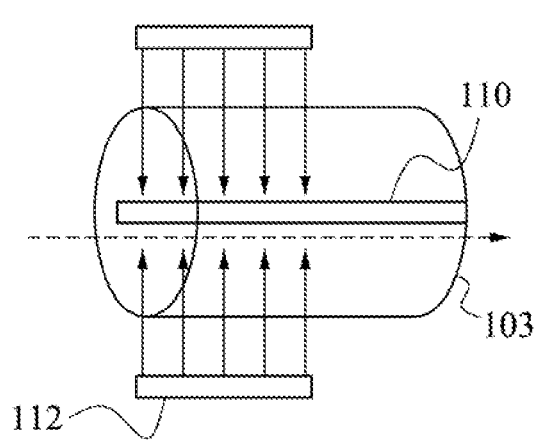
FIG. 2A is an enlarged detail of FIG. 1A, showing a portion of a tube comprising a photocatalyst in accordance with some embodiments.
Figure 2B:
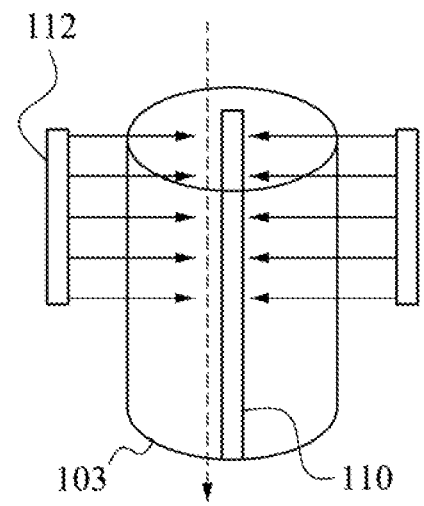
FIG. 2B is a perspective view showing a portion of a tube comprising a photocatalyst in a vertical orientation in accordance with some embodiments.

FIGS. 2A-2F illustrate different exemplary configuration comprising a photocatalyst 110, the tube 103, and a light source 112. In FIGS. 2A-2F, the solid lines with arrows represent light irradiation from the light source 112. The dotted line with an arrow represent the flowing direction of a liquid containing composition within a tube, which is also a longitudinal axis of the tube. As shown in FIG. 2B, a photocatalyst 110 is mounted upstream of the nozzle 104 such that the liquid containing composition passes over the photocatalyst 110 before exiting through the nozzle 104. For example, the photocatalyst 110 can be mounted within the tube 103.

The photocatalyst 110 comprises any suitable material depending on chemical composition of the liquid containing composition, solution or solvent used. In some embodiments, the liquid containing composition, solution or solvent comprises hydrogen peroxide, which is photo-degraded to provide radicals for increasing material removal rate. The photocatalyst 110 for photo-degradation of hydrogen peroxide may be any transition metal, or a compound such as oxide thereof. Examples of a suitable photocatalyst include, but are not limited to, iron, titanium, zinc, manganese, silver, platinum, and corresponding oxide. For example, the photocatalyst 110 may be a metal oxide such as titanium oxide ($TiO_2$), iron oxide ($Fe_2O_3$), manganese dioxide, and zinc oxide (ZnO) or a combination thereof in some embodiments.

Figure 2C:
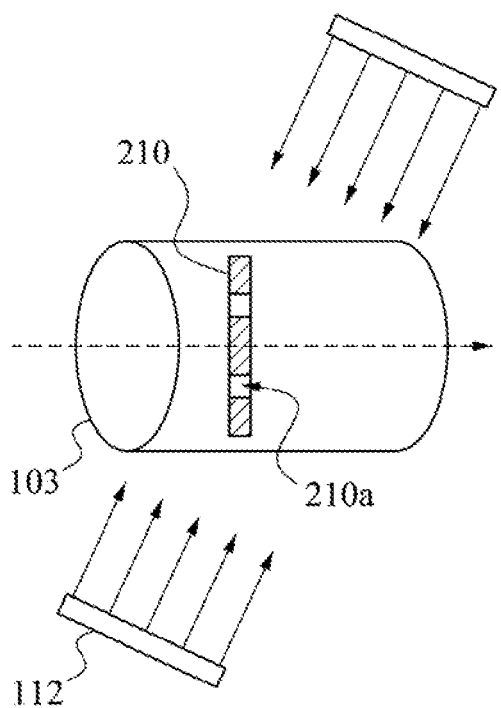
FIG. 2C is a perspective view showing a portion of a tube comprising an exemplary disc-shaped photocatalyst configuration in accordance with some embodiments.

The photocatalyst 110 can be in any suitable configuration. The photocatalyst 110 can be mounted parallel to the flow of the liquid containing composition (as shown in FIG. 2A), or perpendicular to the flow of the liquid containing composition (as shown in FIG. 2C), or at any intermediate angle. In addition, the photocatalyst 110 can be mounted in any appropriate manner. For example, the photocatalyst 110 can be inserted through an end of the tube 103 and engage the inside wall of the tube 103. In such embodiments, the photocatalyst 110 can be retained by a cylindrical carrier which fits tightly within the tube 103 to retain the photocatalyst therein.

Figure 1B:
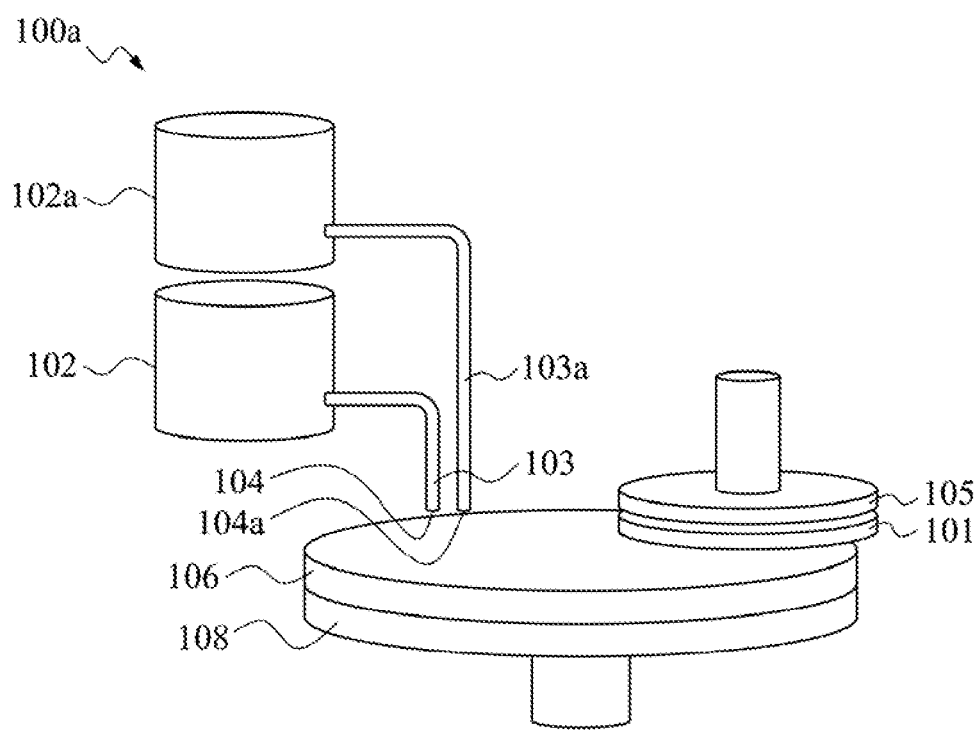
FIG. 1B is a schematic view showing another exemplary CM' system in accordance with some embodiments.

In other embodiments, as shown in FIG. 1B, a CMP system 100a further includes a second tank 102a in communication with a second nozzle 104a through a second tube 103a. In such embodiments, the photocatalyst 110 is disposed upstream of the second nozzle 104a, for example in the second tube 103a. In some embodiments the second tank 102a contains a solution or a solvent such as water, and the first tank 102 contains a slurry. Both the solution and the slurry are introduced to the pad 106. In some embodiments, the solution may contains hydrogen peroxide, and is subject to light irradiation in the second tube 103a. Optionally, the slurry in the first tank 102 also contains hydrogen peroxide, and is subject to light irradiation in the first tube 103. Two or more sets of tanks and tubes can be used, depending on a formulation to be used. One or more of the tubes are subject to light irradiation.

The photocatalyst can be any appropriate shape and size. For example, the photocatalyst 110 can be a rectangular plate or rod. As shown in FIGS. 2A and 2B, in one embodiment the photocatalyst 110 is a plate. The plate may have any suitable thickness, for example, at micron or millimeter levels. The plate comprises a catalytic material, such as a transition metal or oxides thereof. In other embodiments, the photocatalyst 110 comprises a coating layer including a photocatalytic material. For example, in one embodiment, the photocatalyst includes a layer including a transition metal with a thickness between about 5 nm and about 3000 nm, for example, between about 10 nm and about 1000 nm, or between about 30 nm and about 700 nm.

In other embodiments, as shown in FIG. 2C, a disc-shaped photocatalyst 210 is provided in the tube 103. In such embodiments, the photocatalyst 210 can be any appropriate diameter. For example, the diameter of the photocatalyst may be between about 40% and about 95%, for example, between about 60% and about 85%, of the inner diameter of the tube 103. In some embodiments, the diameter of the photocatalyst is about 75% of the inner diameter of the tube 103. In addition, the photocatalyst 210 can define passages 210a therethrough. The passages 210a can allow for the passage of the liquid containing composition therethrough. The passages 210a can also increase the surface area of the photocatalyst 210 for increased interaction with the light provided by the light source 112. As shown in FIG. 2C, the light source can be arranged at an angle with respect to the tube 103. Although illustrated with respect to the embodiment of FIG. 2C, the light source 112 can be oriented at an angle in any embodiment, including those illustrated in FIGS. 2A-2F.

Figure 2D:
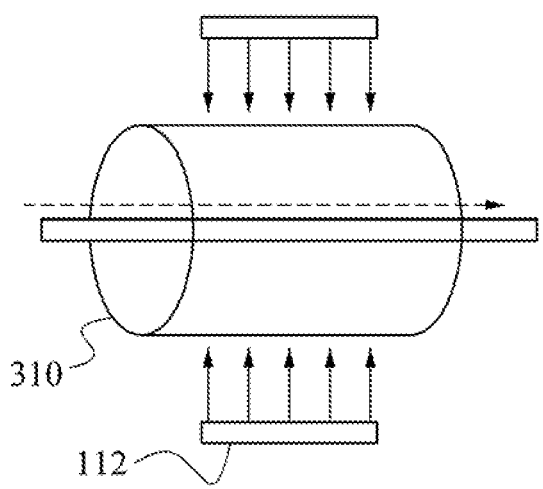
FIG. 2D is a perspective view showing an exemplary cylindrical photocatalyst configuration in accordance with some embodiments.

In other embodiments, the photocatalyst is in the form of a hollow cylinder, as shown in FIG. 2D (the tube is not shown in FIG. 2D). The cylindrical photocatalyst 310 can be any appropriate size. For example, the diameter of the cylindrical photocatalyst 310 is between about 40% and about 95%, for example, between about 60% and about 85% of the inner diameter of the tube 103. In one embodiment, the cylindrical photocatalyst 310 has a diameter of about 75% of the inner diameter of the tube 103. In some embodiments, the longitudinal axis of the cylindrical photocatalyst 310 is oriented parallel to the direction of flow of the liquid containing composition through the tube 103 adjacent to the nozzle 104, which, at least in some embodiments, coincides with the longitudinal axis of the tube 103. In other embodiments, the longitudinal axis can be at an angle other than parallel with the direction of flow. For example, the longitudinal axis can be perpendicular to the direction of flow.

Figure 2E:
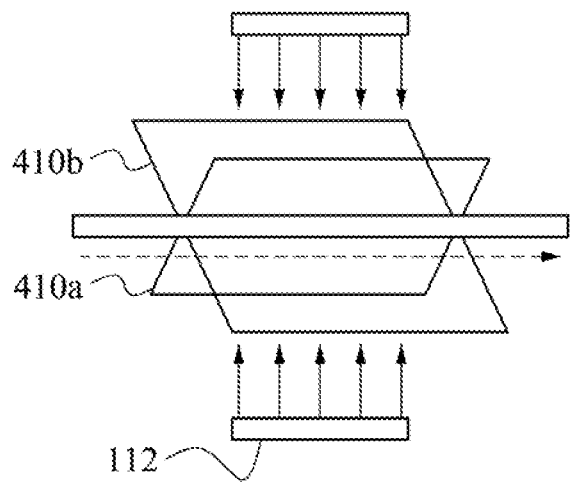
FIG. 2E is a perspective view showing an exemplary photocatalyst configuration comprising two photocatalyst plates mounted perpendicularly to one another in accordance with some embodiments.

As shown in FIG. 2E, multiple photocatalysts or units can be provided. As shown in FIG. 2C, a first photocatalyst 410a and a second photocatalyst 410b can be mounted perpendicular to one another, for example, in an x-configuration. The embodiment illustrated in FIG. 2E shows two rectangular plate shaped photocatalysts. In other embodiments three or more photocatalysts or photocatalyst units are used. Additionally, multiple photocatalysts of any desired shape can be used.

Figure 2F:
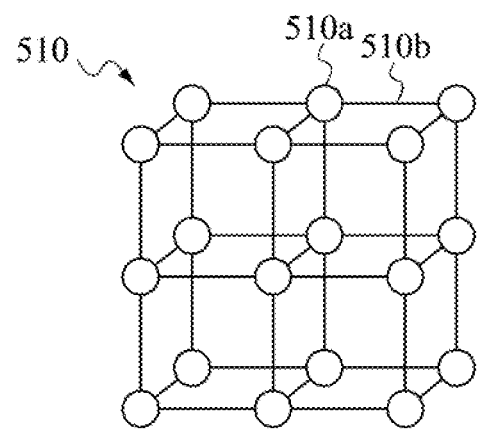
FIG. 2F is a perspective view showing a plurality of photocatalysts mounted in a grid in accordance with some embodiments.

In some embodiments, a photocatalyst is arranged in a lattice structure. FIG. 2F shows a photocatalyst lattice 510 made up of a plurality of units 510a mounted to a frame 510b. The photocatalyst lattice 510 can include any number of units 510a. For example, in some embodiments, the photocatalyst lattice 510 includes between about 10 and about $10^6$ units. In some embodiments, the photocatalyst lattice 510 includes between about 10 and about 10,000 units, for example, between about 100 and about 1000 units, or between about 1000 and about 10,000 units. The number of units 510a of the photocatalyst lattice 510 can be referred to as the photocatalytic number. In addition, the units 510a can be of any appropriate shape. For example, the units 510a can be spherical, cuboid, pyramidal, cylindrical, spheroid, rectangular or any other appropriate shape or combinations thereof. In addition, the photocatalyst lattice 510 can take any form. For example, the photocatalyst lattice 510 can be in the form of a grid, as shown in FIG. 2F. In other embodiments, the photocatalyst lattice 510 can be cylindrical, spherical, pyramidal, spheroid, or any other appropriate shape.

The description below with reference to CMP system 100, shown in FIG. 1A, and photocatalyst 110, shown in FIG. 2A. However, it should be understood that the description applies to each of the embodiments shown and described, as well as other embodiments within the scope of this disclosure.

A light source 112 is mounted proximate the photocatalyst 110 such that light emitted by the light source 112 is directed to the photocatalyst 110 to irradiate the photocatalyst 110 and the liquid containing composition passing through the at least one tube. For example, the light source 112 can be mounted on either side of the tube 103 connecting the nozzle 104 to the tank 102. The light source 112 can be mounted in a bracket 114 surrounding the tube 103 and/or nozzle 104. The light source 112 may emit light in any range up to a wavelength of about 1000 nm. In some embodiments, the light source 112 emits light in the UV range (wavelength between about 10 nm and about 400 nm). In some other embodiments, the light source 112 emits light with a wavelength of from about 400 nm to about 800 nm, for example, from about 400 nm to about 600 nm, or about 600 nm to about 800 nm.

In some embodiments, the light source 112 supplies light to the photocatalyst at an intensity of between about $10^{-6}$ µW/cm$^2$ to about $10^{20}$ µW/cm$^2$. For example, the light source 112 supplies light to the photocatalyst at an intensity of between about 10 µW/cm$^2$ and about $10^{10}$ µW/cm$^2$ in some embodiments. In another embodiment, the light source 112 supplies light to the photocatalyst at an intensity of between about 100 µW/cm$^2$ and about 10,000 µW/cm$^2$.

The light source 112 can emit light continuously or non-continuously. For example, in one embodiment, the light source 112 is pulsed, or turned on and off, at a predetermined frequency. The predetermined frequency can be any appropriate frequency.

The application of the light to the photocatalyst 110 initiates a series of reactions that lead to the release of hydroxyl radicals into the liquid containing composition. These hydroxyl radicals are oxidative and cause the removal rate of the system to increase. The interaction of the metal oxide (MO) photocatalyst 110 with the light causes the formation of a free electron and an electron hole (h$^+$) according the following reaction:

$$\text{light} + MO \rightarrow MO(h^+ + e^-)$$

The electron hole and the free electron are the basis for reaction pathways that each provide hydroxyl radicals in the liquid containing composition. The electron hole forms the basis for oxidative reactions and the free electron forms the basis for a reductive reaction. First, the electron hole reacts with H$_2$O as shown in the following reaction:

$$h^+ + H_2O \rightarrow H^+ + \cdot OH$$

In addition, hydroxyl radicals can also be formed by electron holes through the following reactions:

$$2h^+ + 2H_2O \rightarrow 2H^+ + H_2O_2$$

$$H_2O_2 \rightarrow 2 \cdot OH$$

The free electron forms the basis of reductive reactions by first combining with O$_2$:

$$e^- + O_2 \rightarrow \cdot O_2^-$$

$$O_2^- + HO \cdot 2 + H^+ \rightarrow H_2O_2 + O_2$$

$$HOOH \rightarrow HO \cdot + \cdot OH$$

Figure 3:
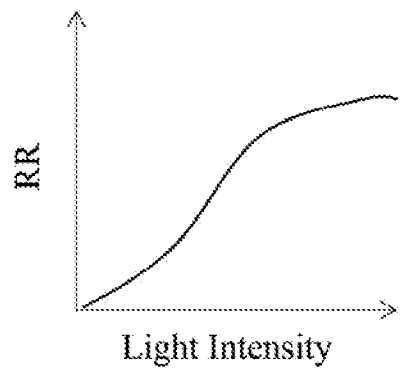
FIG. 3 is a graph illustrating the relationship of removal rate and light intensity.

Through the generation of these hydroxyl radicals, the MRR of the system can be increased. As shown in FIG. 3, experimentation has shown that increasing the intensity of the light source (e.g., UV) increases the removal rate of the system. The increased intensity of the light source 112 increases the concentration of hydroxyl radicals in the liquid containing composition deposited on the pad.

Hence, the removal rate can be adjusted in real time to counteract the natural reduction in removal rate of traditional CMP systems. To this end, the thickness of the substrates can be measured after undergoing the CMP process. If the thickness of the substrate is above a predetermined maximum allowable thickness, the within substrate non-uniformity is above acceptable levels, or a trend is seen in a series of substrates that the thickness of the substrates is increasing, the intensity of the light source can be increased. This causes the removal rate to increase and the thickness to be reduced. This can be done through automated systems to provide real time correction of the removal rate, as will be described further herein.

Figure 4:
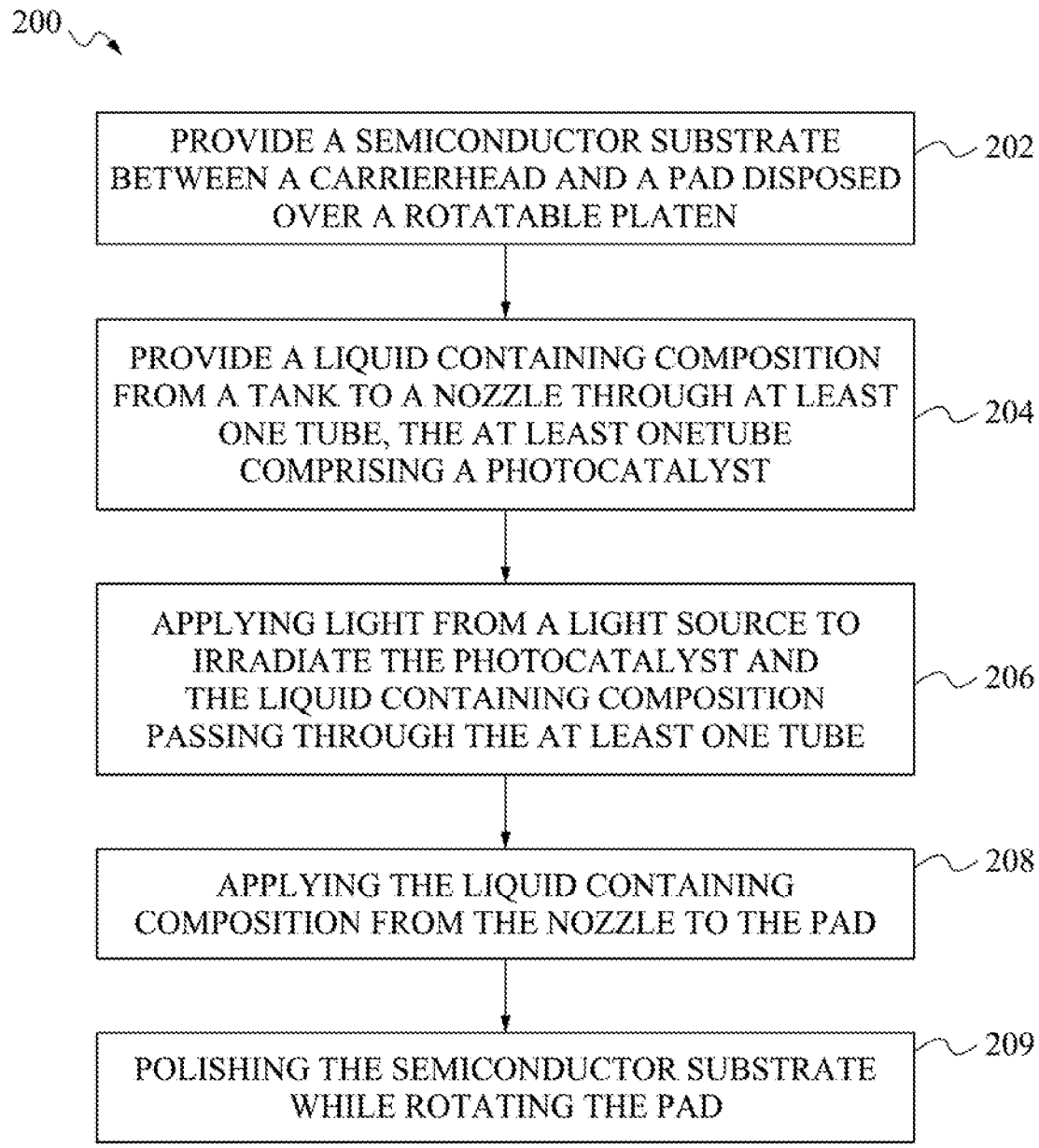
FIG. 4 is a flow chart illustrating an exemplary method for polishing and/or planarization of a substrate using a CMP system with a photocatalyst and a light source in accordance with some embodiments.

Turning to FIG. 4, a method 200 of polishing a semiconductor substrate is described. The method described in FIG. 4 is described with reference to the exemplary structure described in FIGS. 1-2. At block 202, a semiconductor substrate 101 is provided between a carrier head 105 and a pad 106. The pad 106 is disposed over a rotatable platen 108. At block 204, a liquid containing composition is provided from a tank 102 to a nozzle 104 through a tube 103. The tube 103 includes a photocatalyst. At block 206, a light from a light source is applied to the photocatalyst to irradiate the photocatalyst and the liquid containing composition passing through the tube. At block 208, the liquid containing composition is applied from the nozzle to the pad. At block 209, the semiconductor substrate is polished while rotating the pad.

Figure 5:
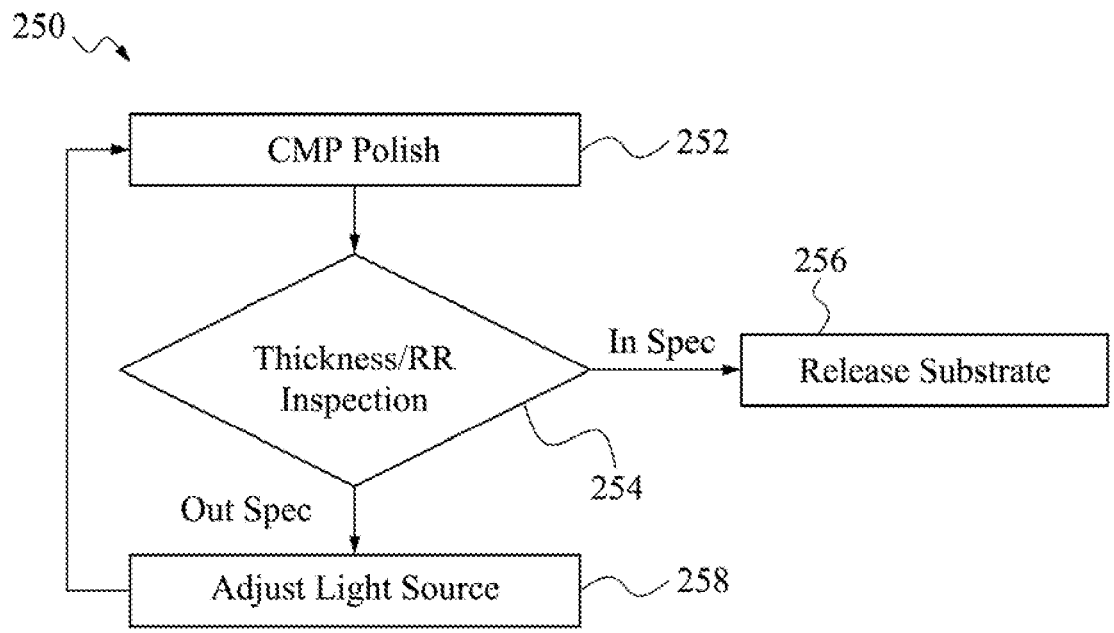
FIG. 5 is a flow chart illustrating a method of adjusting the material removal rate of a CMP system with a photocatalyst and a light source in accordance with some embodiments.

In other aspects a method 250, as shown in FIG. 5, includes adjusting the intensity of the light applied by the light source to adjust the material removal rate of the system. At block 252, a substrate 101 is polished using the CMP system 100. After polishing the semiconductor substrate 101 for a period of time, at block 254, the thickness of the substrate 101 is measured to determine the material removal rate. If the thickness of the substrate 101 is less than a predetermined maximum allowable thickness, at block 256, the substrate is released from the CMP process. If, however, the thickness of the substrate 101 is greater than the predetermined maximum allowable thickness, or the within substrate non-uniformity is unacceptable, at block 258, the intensity of the light source 112 is adjusted. The adjustment of the intensity of the light source 112 may include an increase of the intensity of the light source 112, from a first intensity to a second intensity. The intensity of the light source 112 may be adjusted based on a pre-determined standard curve comprising a plurality of light intensity values and a plurality of MRR values resulting from the plurality of light intensity values. After adjustment of the light source 112, the substrate 101 is polished again at block 202 and the process is repeated until the thickness of the substrate 101 is below the predetermined maximum allowable thickness. In this way, the system can be automatically adjusted to maintain the MRR at a level that causes the thickness of the substrates to be within acceptable thickness tolerances.

After completion of processing the previous substrate, a subsequent substrate can then be processed. The intensity of the light source 112 can be maintained at the same or a second intensity when processing the subsequent substrate. This process can be repeated for any number of substrates. In some embodiments, the MRR is controlled and maintained at the same level cover a period of time such as days or months.

Figure 6:
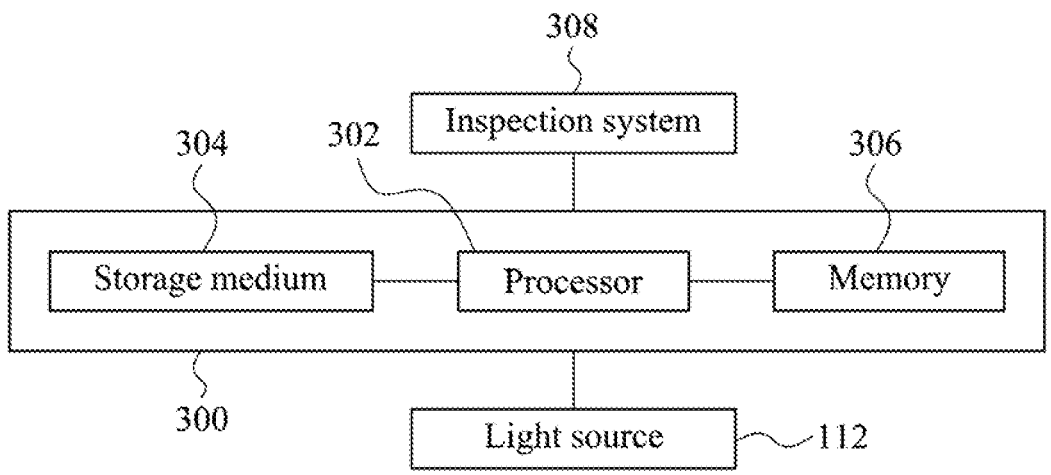
FIG. 6 is a block diagram showing an exemplary automated system for adjusting the intensity of the light source in accordance with some embodiments.

In some embodiments, the adjustment of light source 112 is performed manually by an operator. In some other embodiments, as shown in FIG. 6, the intensity of the light source 112 is controlled automatically by a computer 300. The computer 300 includes a processor 302, a non-transitory computer readable (machine readable) storage medium 304, and memory 306. The storage medium 304 includes instructions for controlling the light source 112 based on input from the inspection system 308. The inspection system 308 can include any appropriate tools and systems for inspecting the thickness of the substrate. This can include contact or non-contact inspection tools. Memory 306 stores information related to a correlation between MRR and light intensity. Based on these correlations, and the data supplied by the inspection system 308, the processor 302 determines the appropriate intensity for the light source 112. The processor 302 then provides the instructions necessary to adjust the light source 112 to this intensity. In this way, the intensity of the light source 112 is automatically adjusted to maintain the desired MRR and corresponding substrate thickness.

The present disclosure provides an apparatus for chemical-mechanical planarization (CMP), and a method of performing CMP. In accordance with some embodiments, such an apparatus for chemical-mechanical planarization includes a pad, a carrier head, a tank, and a light source. The pad is disposed over a rotatable platen. The carrier head is disposed over the pad and configured to retain a semiconductor substrate between the pad and the carrier head. The tank is configured to retain a liquid containing composition (e.g., a slurry, a solution, or a solvent). At least one tube is fluidly coupled with the tank and the at least one tube includes a photocatalyst therein. A nozzle is fluidly coupled with the tank through the at least one tube and configured to supply the liquid containing composition onto the pad. The light source is configured to provide light to irradiate the photocatalyst and the liquid containing composition passing through the at least one tube.

In some embodiments, the photocatalyst comprises a transition metal or a compound thereof. In at least one embodiment, the photocatalyst comprises a metal oxide selected from the group consisting of titanium oxide, iron oxide, manganese dioxide, zinc oxide, and a combination thereof.

In some embodiments, the photocatalyst defines a longitudinal axis along its longest side, and the longitudinal axis is oriented parallel or normal to a longitudinal axis of the at least one tube. the photocatalyst comprises at least one unit. Each unit is selected from the group consisting of a sphere, a cube, a pyramid, a cylinder, a rectanguloid, a plate, or a combination thereof. In some embodiments, the photocatalyst has a photo-catalytic number in a range of from 10 to $10^6$ (e.g., from 100 to 1,000, from 1,000 to 10,000) defined by a total number of the at least one units.

In some embodiments, the light source is configured to emit light at an adjustable intensity. For example, the light may be visible light or ultraviolet light. In some embodiments, the apparatus may comprise two or more sets of tanks and tubes. For example, a first tank may contain a slurry, and a second tank may contain a solution comprising hydrogen peroxide. The tube connected with the second tank includes photocatalyst therein. The light is applied to the tube connected with the second tank. The solution comprising free radicals upon light irradiation is mixed with the slurry before reaching the nozzle or before applied onto the pad.

In some embodiments, the liquid containing composition is a slurry or a solution comprising hydrogen peroxide, which generate free radical upon light irradiation in the presence of the photocatalyst.

In another aspect, the present disclosure provides a method including providing a semiconductor substrate between a carrier head and a pad disposed over a rotatable platen. The carrier head is configured to retain the semiconductor substrate between the pad and the carrier head. The method also includes providing a liquid containing composition from a tank to a nozzle through at least one tube fluidly coupled with the tank and the nozzle, the at least one tube comprising a photocatalyst therein. The method also includes applying light from a light source to irradiate the photocatalyst, and the liquid containing composition passing through the at least one tube. The method also includes applying the liquid containing composition from the nozzle to the pad and polishing the semiconductor substrate while rotating the pad.

In some embodiments, the method also includes measuring a thickness of the semiconductor substrate after polishing the semiconductor substrate for a period of time to determine material removal rate (MRR). The MRR is calculated based on the difference between a final thickness and an initial thickness over the period of time for polishing The method may further include adjusting intensity of the light so as to achieve a pre-determined MRR. The intensity of light is adjusted based on a pre-determined standard curve comprising a plurality of light intensity values and a plurality of MRR values resulting from the plurality of light intensity values. Such a standard curves may be saved in a computer.

In some embodiments, the photocatalyst comprises a transition metal or a compound thereof. For example, the photocatalyst comprises a metal oxide selected from the group consisting of titanium oxide, iron oxide, manganese dioxide, zinc oxide, and a combination thereof.

In some embodiments, the photocatalyst comprises at least one unit, each of which is selected from the group consisting of a sphere, a cube, a pyramid, a cylinder, a rectanguloid, a plate, or a combination thereof. In some embodiments, the photocatalyst has a photo-catalytic number in a range of from 10 to $10^6$ (e.g., from 100 to 1,000, from 1,000 to 10,000) defined by a total number of the at least one units.

In some embodiments, the light source is configured to emit light at an adjustable intensity. In at least one embodiment, the light is visible light or ultraviolet light.

The photocatalyst defines a longitudinal axis along its longest side, and the longitudinal axis is oriented parallel (or normal) to a longitudinal axis of the at least one tube.

The liquid containing composition is a slurry or a solution comprising hydrogen peroxide in some embodiments.

In accordance with some embodiments, a method includes providing a semiconductor substrate on a pad disposed over a rotatable platen. The method also includes providing a liquid containing composition from a tank to a nozzle through at least one tube fluidly coupled with the tank and the nozzle. The at least one tube comprises a photocatalyst therein. The liquid containing solution is a slurry or a solution comprising hydrogen peroxide in some embodiments. The photocatalyst comprises a transition metal or a compound thereof. The method also includes applying light from a light source to irradiate the photocatalyst, and the liquid containing composition passing through the at least one tube. The light is visible light or ultraviolet light. The method also includes applying the liquid containing composition from the nozzle to the pad and polishing the semiconductor substrate while rotating the pad.

In at least one embodiment, the method includes measuring a thickness of the semiconductor substrate after polishing the semiconductor substrate for a period of time to determine material removal rate (MRR). Such embodiments also include adjusting intensity of the light so as to achieve a pre-determined MRR.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a tank configured to retain a liquid containing composition;
   at least one tube fluidly coupled with the tank, the at least one tube comprising a photocatalyst therein;
   a nozzle fluidly coupled with the tank through the at least one tube and configured to supply the liquid containing composition onto a pad for chemical-mechanical planarization (CMP) of a semiconductor substrate; and
   a light source configured to provide light to irradiate the photocatalyst, and the liquid containing composition passing through the at least one tube.

2. The apparatus of claim 1, wherein the photocatalyst comprises a transition metal or a compound thereof.

3. The apparatus of claim 1, wherein the photocatalyst comprises a metal oxide selected from the group consisting of titanium oxide, iron oxide, manganese dioxide, zinc oxide, and a combination thereof.

4. The apparatus of claim 1, wherein the photocatalyst defines a longitudinal axis, and the longitudinal axis is oriented parallel to a longitudinal axis of the at least one tube.

5. The apparatus of claim 1, wherein the photocatalyst comprises at least one unit, each unit selected from the group consisting of a sphere, a cube, a pyramid, a cylinder, a rectanguloid, a plate, or a combination thereof.

6. The apparatus of claim 5, wherein the photocatalyst has a photocatalytic number in a range of from 10 to $10^6$ defined by a total number of the at least one unit.

7. The apparatus of claim 1, wherein the light source is configured to emit light at an adjustable intensity.

8. The apparatus of claim 1, wherein the light is visible light or ultraviolet light.

9. The apparatus of claim 1, wherein the liquid containing composition is a slurry or a solution comprising hydrogen peroxide.

10. A method, comprising:
    providing a liquid containing composition from a tank to a nozzle through at least one tube fluidly coupled with the tank and the nozzle, the at least one tube comprising a photocatalyst therein;
    applying light from a light source to irradiate the photocatalyst, and the liquid containing composition passing through the at least one tube; and
    applying the liquid containing composition from the nozzle to a pad for chemical-mechanical planarization (CMP) of a semiconductor substrate.

11. The method of claim 10, further comprising:
    polishing the semiconductor substrate while rotating the pad.

12. The method of claim 10, further comprising:
    measuring a thickness of the semiconductor substrate after polishing the semiconductor substrate for a period of time to determine material removal rate (MRR); and
    adjusting intensity of the light so as to achieve a pre-determined MRR.

13. The method of claim 10, wherein the intensity of light is adjusted based on a pre-determined standard curve comprising a plurality of light intensity values and a plurality of MRR values resulting from the plurality of light intensity values.

14. The method of claim 10, wherein the photocatalyst comprises a metal oxide selected from the group consisting of titanium oxide, iron oxide, manganese dioxide, and zinc oxide.

15. The method of claim 10, wherein the photocatalyst comprises at least one unit, each unit selected from the group consisting of a sphere, a cube, a pyramid, a cylinder, a rectanguloid, a plate, or a combination thereof.

16. The method of claim 10, wherein the photocatalyst has a photo-catalytic number in a range of from 10 to $10^6$ defined by a total number of the at least one units.

17. The method of claim 10, wherein the photocatalyst defines a longitudinal axis along its longest side, and wherein the longitudinal axis is oriented parallel to the flow of the slurry adjacent to the nozzle.

18. A method comprising:

providing a liquid containing composition from a tank to a nozzle through at least one tube fluidly coupled with the tank and the nozzle, the at least one tube comprising a photocatalyst therein, wherein the liquid containing solution is a slurry or a solution comprising hydrogen peroxide, and wherein the photocatalyst comprises a transition metal or a compound thereof;

applying light from a light source to irradiate the photocatalyst, and the liquid containing composition passing through the at least one tube, wherein the light is visible light or ultraviolet light; and applying the liquid containing composition from the nozzle to a pad for chemical-mechanical planarization (CMP) of a semiconductor substrate while rotating the pad.

19. The method of claim 18, further comprising:

measuring a thickness of the semiconductor substrate after polishing the semiconductor substrate for a period of time to determine material removal rate (MRR); and adjusting intensity of the light so as to achieve a predetermined MRR.

20. The method of claim 18, wherein the liquid containing composition is a slurry or a solution comprising hydrogen peroxide.

\* \* \* \* \*